United States Patent
Nauerth

[11] Patent Number: 5,545,991
[45] Date of Patent: Aug. 13, 1996

[54] LOW-NOISE NMR IMAGING METHOD WITH SINGLE POINT RECORDING (SPI)

[75] Inventor: Arno Nauerth, Erlenbach, Germany

[73] Assignee: Bruker Medizintechnik Gmbh, Rheinstetten, Germany

[21] Appl. No.: 317,890

[22] Filed: Oct. 4, 1994

[30] Foreign Application Priority Data

Oct. 6, 1993 [DE] Germany .................. 43 34 038.5

[51] Int. Cl.⁶ .................. G01V 03/00; G01V 03/14
[52] U.S. Cl. .................. 324/307; 324/309
[58] Field of Search .................. 324/300, 307, 324/309, 311, 312, 318

[56] References Cited

U.S. PATENT DOCUMENTS 4,070,611 1/1978 Ernst.
5,160,888 11/1992 Laukien .................. 324/309

FOREIGN PATENT DOCUMENTS 3434161 7/1988 Germany.

OTHER PUBLICATIONS

Hall, Laurance D., Rajanayagam, Vasanthan, and Sukumar, S.: Chemical–Shift–Resolved Tomography Using Four–Dimensional FT Imaging. In: Journal of Magnetic Resonance vol. 61, 1985, pp. 188–191.

Maudsley, A. A., Hilal, S. K., Perman, W. H. and Simon, H. R.: Spatially Resolved High Resolution Spectroscopy by "Four–Dimensional" NMR. In: Journal of Magnetic Resonance, vol. 51, 1983, pp. 147–152.

Nauerth, A. and Gewiese, B.: SPI–Single Point FID Imaging. In: 12th Annual Scientific Meeting of SMRM, Aug. 1993, New York, Contributions p. 1215.

Primary Examiner—Sandra L. O'Shea
Assistant Examiner—Mack Haynes

[57] ABSTRACT

In an SPI method for the n-dimensional NMR imaging of materials with short $T_2$-relaxation times, for example cartilage or bones, only one single measurement point in k-space is recorded from the phase encoded FID signal following each RF excitation pulse. A pseudo spin echo (4) is derived from the extracted k-space points which has essentially the same information content as a conventional spin echo signal. In order to prevent excessive noise development when switching the gradients, the gradients are also applied during the waiting time between the recording of individual points, and the stepwise change of the gradient fields from one point to the next is done in such a fashion that at least one of the gradient fields is not fully switched-off between two individual points rather only changed, in each case, by an increment value which is very small compared to the maximum value of the corresponding gradient fields, whereby the size of the increment value corresponds to one to z-times the separation between two neighboring points in k-space, and preferentially $z<5$.

22 Claims, 4 Drawing Sheets

LOW-NOISE NMR IMAGING METHOD WITH SINGLE POINT RECORDING (SPI)

BACKGROUND OF THE INVENTION

The invention concerns a method for n-dimensional NMR imaging with which a measurement object, within a measurement volume in a homogeneous magnetic field $B_0$ directed parallel to a z-axis, is subjected to radio frequency (RF) excitation pulses, whereby the homogeneous magnetic field $B_0$ is overlapped with gradient fields, in particular phase encoding gradients, which are stepwise changed in strength and/or duration to sample the n-dimensional k-space. Following each RF excitation pulse and within at least one detection time-window, an NMR signal is recorded having at least one measurement value from the measurement volume and only measurement values are recorded which are associated with precisely one point of an n-dimensional matrix in k-space. Exactly n phase encoding gradients are applied between the RF excitation pulses during the time duration of the detection time-window to uniquely determine the point in k-space, and precisely the same number of RF excitation pulses are sequentially irradiated as there are points in k-space to be sampled. By means of a reconstruction algorithm, an n-dimensional image in position space is extracted from the n-dimensional matrix in k-space.

A method of this kind is known form the article "SPI-Single Point FID Imaging" by A. Nauerth and B. Gewiese; conference contribution to the 12th Annual Scientific Meeting of SMRM, 14th-20th August 1993, New York, p. 1215.

With methods known in the art, a transverse magnetic moment is excited in the nuclei of a measurement sample with the assistance of a 90° RF excitation pulse. After switching off the 90° pulse a so-called free induction decay (FID) occurs which can be observed as the time changing nuclear resonance signal. Without the presence of field inhomogeneities, in particular without the presence of gradient fields, the time oscillating FID-signal would be damped with constant resonance frequency in homogeneous magnetic fields $B_0$ with a time constant $T_2$ largely due to spin-spin interactions and, taking into consideration field inhomogeneities, with the shorter effective relaxation time $T_2^*$.

In a method known from U.S. Pat. No. 4,070,611, a gradient field $G_x$ in the x-direction of time duration $t_x$, is, however, irradiated into the measurement volume directly following the 90° pulse, subsequent thereto a gradient field $G_y$ in the y-direction of time duration $t_y$, and finally a gradient field $G_z$ in the z-direction of time duration $t_z$. Due to the action of the gradient fields the corresponding resonance frequency of the FID signal is changed in a characteristic fashion. In this method, which is known in the art the time changing FID-signal is recorded and stored during the entire time duration of the application of the gradient fields. A corresponding signal in frequency space, which can be assigned to an image point in space, is derived from the stored time signal by means of Fourier transformation. Through multiple repetition of this method using changed gradient strength or gradient durations it is possible to produce a two- or three-dimensional image of the measurement object. By irradiating only two gradient fields (X- and Y-gradients) two-dimensional slice images can also be obtained.

A disadvantage of the known latter mentioned method is that a gradient field is switched at the beginning of the recording of the FID signal. The influence of these fields during the gradient switching occurring during the course of the measurements on the quality of the measurement signals derived is technically difficult to handle, and in particular, the interpretative capability of the measured results is thereby compromised.

A further disadvantage resulting from the latter mentioned known method, is that each FID signal and thereby each measurement point in k-space (= Fourier transformed space) contains different information with regard to the effective $T_2^*$ relaxation time. In addition, each measurement point is subject to different diffusion effects. Since the diffusion effects due to the spatial motion of nuclei and the resulting non-directional flow effects, contribute to the measurement with the square of the time duration following the end of the excitation pulse the differences due to diffusion effects between the individually obtained FID signals are particularly large. In the latter mentioned known method the FID signal is, namely, detected over a fairly large time duration between the switching off of the RF excitation pulse and a noticeable decay of the FID signal.

In order that all measurement values leading to points in k-space are recorded at the same point in time relative to the RF pulse so that each measurement point exhibits the same information with regard to $T_2^*$ relaxation whereby all recorded points in k-space are obtained from measurement values which, with regard to time, are subjected to the same diffusion effects and which are precisely influenced by gradient switching in the same manner, in the above mentioned known SPI method, in contrast, only measurement values following each RF excitation pulse are recorded which are precisely associated with one point in k-space, whereby between the excitation pulse and during the time duration of the detection window, precisely n phase encoding gradients $G_{pH1}, \ldots, G_{pHn}$ are applied which uniquely determine the points in k-space and whereby precisely as many RF excitation pulses are sequentially irradiated as there are points in k-space to be sampled.

In this method the measurement values are recorded in a detection window. In this fashion the influences of the gradient switching on the measured data are equal in all measurement sequences of this method known in the art. Since the detection window starts at a particular fixed point in time $t_0$ after the RF excitation pulse the history of each recorded point in k-space, with respect to relaxation is the same. Also, with regard to time, the diffusion effects are the same for each point in k-space since the recording times relative to the excitation pulse are the same.

The measurement values recorded per excitation pulse in a measurement sequence within the time-window are, in each case, always assigned to only one single k-space point. One is therefore dealing with a method of imaging using single point recording (single point imaging = SPI).

A particular advantage of this SPI method is that the measurement points obtained can be assigned in k-space according to the sequential changes of the phase encoding gradients following the various RF excitation pulses and that the amplitude values plotted against the relative phase in this fashion exhibit the shape and the essential information content of a spin echo signal. In contrast to the conventional spin echo as can be produced, for example in the RARE method described in U.S. Pat. No. 4,818,940, the measurement points of the pseudo spin echo produced with the SPI method which are all recorded at the same relative point in time with respect to the RF excitation pulse are subject to precisely comparable $T_2^*$ information, whereas in the normal spin echo the different measurement points are subject to a more or less strong $T_2^*$ variation.

A further advantage of the SPI method is that NMR recordings of materials with relatively short $T_2$ relaxation times can also be obtained. Using the conventional spin echo imaging method, images of only materials with long $T_2$ relaxation times, for example water containing tissue, can be recorded. Bones, cartilage, and other solid body components, in contrast thereto, give NMR signals which can still be detected at the point of time of the 180° RF pulse which usually follows the 90° excitation pulse at a time T but after additional time intervals T at which the maximum of conventional spin echo signals lies, have signal strengths which have fallen below the measurable limit. Precisely such NMR recordings of materials with short $T_2^*$ relaxation times can, however, still be carried out with the SPI method since here the detection window directly follows the phase encoding and no additional time $\tau$ must be waited up to the appearance of the first maximum of the echo.

The SPI method also exhibits the advantage which was mentioned above of, on the average, an equal contribution from diffusion effects at every measurement point in contrast to the conventional spin echo imaging method with which the contribution of diffusion is different at every measurement point of the spin echo.

The position resolution in NMR imaging methods is in general limited by the dephasing effects at the maximal achievable gradient strength. By lengthening the phase encoding time for fixed echo time, i.e. the time between the excitation pulse and recording of the data, the SPI method can achieve a much larger position resolution than the conventional spin echo imaging method. Whereas in a conventional spin echo experiment a time duration of $3\tau$ is needed between the first excitation pulse and the end of the spin echo and the applied gradient is only active during the time period $\tau$ from the beginning of the echo up to the maximum of the echo, the phase encoding gradient in the SPI method is active over the entire duration of the applied gradient.

In a conventional spin echo experiment with slice selection, in addition to the above mentioned time duration $3\tau$, there is also the time needed for the RF excitation pulse of "soft" pulse shape such as, for example, Gaussian or Hermite pulses. Taken together the field of view can thereby be reduced by a factor of 2 to 3 for constant echo times corresponding to a zoom factor of likewise 2 to 3 and a much larger position resolution.

On the other hand, for constant field of view, the echo time can be correspondingly shortened with the SPI method in comparison to the conventional spin echo experiment so that the diffusion processes which, as discussed above, increase quadratically with the echo time, can be strongly reduced. It is also possible in this fashion to achieve, using the SPI method, a greatly increased image quality in comparison to conventional spin echo imaging methods.

An excellent summary of the above mentioned known methods is given in the Review Article of David G. Cory in Ann. Reports on NMR Spectroscopy, Vol. 24, p. 114ff.

A serious problem of the known SPI method is associated with the extremely loud noise caused by the standard switching of the gradients from zero to the gradient strength which is necessary in each case. One pushes the gradient strength to the technical limit whereby the gradients are switched-on and off with repetition times in the millisecond range. In the known SPI methods one, to the extent possible, only switches the gradients in the interval between the RF excitation pulse and the beginning of the detection with microsecond precision. For reasons of stability, the gradient is, however, switched-on shortly before the RF excitation pulse and switched-off shortly after detection. In order to derive a usable phase encoding during this, due to the small time constant $T_2$, extremely short time interval, it is necessary for the gradient fields to be extremely strong. For this reason, in the known method, one pushes the power supply to the limits of loadability and/or the gradient coil system to its electrical and thermal load limits.

Up to now, people of skill in the art were of the opinion that the acoustical noise, which usually exceeds the threshold of pain, must be accepted. For analytical measurements in the field of material research, as described in a poster session associated with the above mentioned publication, the loud noises present an unpleasant but easily circumvented problem since the experimentalist, if necessary, can leave the laboratory under automatic or remote control conditions-during the course of the measurement. For in-vivo measurements this easy method of solving the problem is, however, not possible since the object being investigated, in general a sick individual, must remain in the vicinity of gradient system during the measurement. An anesthetization of the patient being examined solely for the purpose of avoiding the problem of noise load is, for medical reasons, not normally acceptable.

There is therefore a great need to, in the above mentioned "single point" measurements, avoid or to at least strongly reduce the enormous acoustical noise without thereby giving up the substantial advantages of the described SPI method, namely, the extremely short time between excitation and the taking of data.

SUMMARY OF THE INVENTION

It is therefore the purpose of the present invention to present an SPI method of the above mentioned kind which is particularly noise-free. This purpose is achieved in accordance with the invention in a surprisingly simple fashion in that the gradients are also applied during the waiting time between the taking of the individual points, and the stepwise changes in the gradient fields from one individual point to the next transpire in such a fashion that at least one of the gradient fields is not completely switched-off between two individual points, rather is, in each case, only changed by one increment value which is very small in comparison to the maximum value of the relevant gradient field, whereby the magnitude of the increment value is from one to z-times the separation between two neighboring points in k-space, and whereby preferentially z<5.

A further surprising advantage of the method in accordance with the invention which demonstrated itself subsequently during experimentation is that, in conventional SPI measurements using "brutal" switched gradients, ghost images appear which display the object under investigation in a plurality of sizes. These are due to the fact that samples with relatively long relaxation times $T_2$ (typically >2 ms) can cause, with short repetition times of the order of 5 ms, stimulated echoes or the transverse magnetization does not completely relax before the next RF excitation pulse. These signal portions (echoes or FID) thereby experience the phase encoding gradient a plurality of times. The result is a halving of the original field of view. This type of imaging artifact disappears under utilization of the CW gradient method in accordance with the invention, since the gradient present during the measurement functions as a "spoiler" gradient. In addition, by not switching-off the gradient a particularly rapid measuring sequence is possible. The subsequent excitation pulses can, namely, be irradiated at times directly following the taking of data if the measurement object exhibits a sufficiently short relaxation time.

In a particularly preferred embodiment of the method in accordance with the invention, the increment values are largely constant for subsequent switching of the appropriate gradients. This simplifies, in particular, the programming of the switching sequence for the various gradient fields.

In a particularly simple embodiment at least one of the n gradient fields to be adjusted, starting from a gradient strength of zero, is, in each case, successively incremented with each recording step by a double phase encoding step up to the maximum positive gradient strength and, subsequently, a negative single phase encoding increment step is intermediately switched-in, following which the gradient field is, in each case, incremented by a double negative phase encoding step down to the maximum negative gradient strength and subsequently a positive single phase encoding increment step is intermediately switched-in, and the gradient fields are, in each case, then incremented by a double positive phase encoding step up to gradient strength zero.

The gradients to be switched, starting at zero, are steadily incremented by a constant increment corresponding to twice the phase encoding step up to a maximum value and then are displayed by a half increment (i.e. a single phase encoding step) with respect thereto and switched linearly down across zero to the maximum negative value to then again be displayed by half of an increment and be led linearly back to the zero point. The envelope of all the adjusted gradient values is triangular, i.e. aside from the tiny increment steps, exhibits linear segments and is generally continuous, that is to say, is without large steps. Typically 128 or 256 values are selected per gradient. This means that the increment to be increased or decreased at any given moment corresponds to only 1/64 or 1/128 of the maximum gradient which then drastically reduces the resulting switching bang to a tolerable level. The current change through the gradient coils is thereby constant with the exception of the two intermediate steps with which the increment changes only by a single encoding step.

In another embodiment, instead of the single negative phase encoding increment step after reaching the maximum positive gradient strength, a single phase encoding step is intermediately switched in as the last positive increment step before reaching the maximum positive gradient strength and/or instead of the positive increment step after reaching the maximum negative gradient strength, a single phase encoding step is intermediately switched in as the final negative increment step before reaching the maximum negative strength. This also leads to a triangular shaped switching cycle for the gradient fields.

A variation of both above mentioned embodiments is preferred in which a second, third or additional gradient field is incremented after each complete switching cycle of the first gradient field in such a fashion that a similar increment curve is transcribed as for the first gradient field, whereby each increment curve exhibits a period of duration increased by the product of the number of increments per period compared to the increment curve of the preceding gradient field. The frequency of the pulse sequence when switching the second, third or additional gradients is correspondingly lower than in the switching sequence of the first gradient but not, however, the frequency components of the switching process itself. With the second gradient, the frequency of the pulse sequence lies in the range of seconds so that a nevertheless extremely unpleasant noise load of "only" one switching bang per second would occur. It is therefore also important to avoid large steps in the gradient strength when switching the second gradient. When switching the third gradient the time duration of the repetition is in general already in the range of minutes so that, in simple embodiments of the method in accordance with the invention, the relatively infrequent switching process can be accepted without further modification.

In order to reduce the instantaneous thermal load on the gradient coils, in an improvement of this embodiment, isolated large switching steps in the increment curve are carried out when switching the second, third or additional gradient fields with which the gradient strength of the corresponding gradient field is changed by at least ten times the phase encoding step, preferentially by half of the maximum gradient strength, whereby the large switching steps are, however, separated in time from another by approximately one half of a minute or longer.

In a particularly preferred embodiment a "soft" turning on of higher gradient values is achieved in that, starting from zero, different initial values of the gradient strength of a gradient field to be switched are turned on over an extended period of time which is significantly larger, preferentially at least ten times larger, than the time duration of a gradient switching process in the normal switching cycle.

In a variation of this embodiment with which the gradient strength of gradient fields whose gradient strengths are to be infrequently changed are always turned on in a time extended fashion, a "switching bang" consequently never occurs.

It is preferred when at least two gradient fields of the switching cycle are chosen in such a fashion that the points to be sampled in k-space, which are to be selected with appropriate gradient strengths, are successively passed through on a closed curve in k-space which exhibits only few crossing points and preferentially none. In this way, k-space is sampled in a "meandering" fashion.

In a preferred embodiment of the method in accordance with the invention two NMR signals, are each phase shifted by 90°, are simultaneously recorded. By means of simultaneous quadrature detection, the real part as well as the imaginary part of the complex signal point is available for analysis.

A further important shortening of the recording time is achieved in another embodiment in which the RF excitation pulse is irradiated into the measurement volume with a high repetition rate and is chosen in such a fashion that the nuclear spins of the measurement object which are directed along the z-axis parallel to the homogeneous magnetic $B_0$ field are coherently moved from their direction by a flip angle which is small compared to 90°.

In an alternative embodiment RF excitation pulses are irradiated into the measurement volume which produce, from the longitudinal magnetization of the nuclei in the measurement object directed along the z-axis, a coherent transverse magnetization in an xy-plane perpendicular to the z-axis, whereby a flip back pulse is irradiated into the measurement volume prior to each additional RF excitation pulse to transfer the coherent transverse magnetization out of the xy-plane back into the z-direction. In this fashion it is possible to achieve a shortened measuring time for $T_2^*$ relaxation times which are relatively long compared to the repetition time of the excitation sequence or to achieve a correspondingly improved signal to noise ratio.

A further improvement of the statistical quality of the k-space points which are recorded is achieved in another embodiment in that, if appropriate, a weighted average value is formed from a plurality of measurement values recorded in the same detection window which is assigned to one single point in k-space.

A loss in signal to noise ratio in consequence of a more rapid repetition rate can be compensated for in an embodiment in which measurement values recorded in the same detection window are subjected to a digital and/or analog filtering, in particular, a low pass filtering subsequent to being mixed-down.

In a preferred embodiment the recording of measurement values transpires using the NMR resonance frequency as the reference frequency so that nearly all frequency components outside the resonance frequency can be filtered out of the measured data.

A form of this embodiment is particularly preferred with which measured values from the same detection window are fitted to a curve having the dependence of the time varying FID signals produced by the RF excitation pulse. This curve results from the $T_2^*$ decay in combination with the progressive dephasing due to the applied gradients. In this fashion a theoretically ideal elimination of noise is possible. The same effect can be achieved by means of filtering which only takes into account those frequency components which are expected in the actual phase encoding of the corresponding applied gradients.

By taking advantage of the symmetry of the pseudo echo, in an embodiment of the method in accordance of the invention, only those point, in k-space are sampled through variation of the influence of the phase encoding gradient on the nuclear spins of the measurement objects which belong to one of the two symmetric halves of the Fourier transformed measurement values which are assimilated into a measurement curve. Since the second half of the pseudo echo does not provide any additional position information, it is thereby sufficient to record only the first half of the ideal "echo signal" in the method in accordance with the invention.

In a further embodiment of the method in accordance with the invention, the phase encoding is effected through simultaneous sequential changing of the gradient strengths of a plurality of the n phase encoding gradients for each RF excitation pulse.

In an embodiment, recording of data can take place at the same relative point of time when the time position of the detection window is held constant relative to the corresponding RF excitation pulse for all RF excitation pulses.

Arbitrary n-dimensional NMR images can be extracted with the method in accordance with the invention. In particular with the choice of n=1, i.e. use of only one phase encoding gradient, a 1-dimensional projection is possible within approximately one second.

A 2-dimensional NMR image can be obtained to form a silhouette as in X-ray images through the application of two phase encoding gradients (n=2). In a further embodiment a slice selection gradient is applied in addition to the two phase encoding gradients. In this fashion a conventional 2-dimensional NMR slice image can be produced from a slice shaped plane of the measurement object.

In a further embodiment three phase encoding gradients are applied which, in particular, are orthogonal, and preferentially in the directions of the x-, y- and z-axes. In this manner a 3-dimensional NMR image is possible.

An application of the method in accordance with the invention is particularly preferred in which the back projection method known for example from the textbook "Principles of NMR Microscopy" of P. T. Callaghan, Oxford Science Publications, Clarendon Press, Oxford, 1991, chapter 1, is used.

In an improvement the switching cycle of the gradient fields is chosen in such a fashion that the points in k-space which are to be recorded and which are to be selected with appropriately adjusted gradient strengths lie on concentric spherical shells in a spherical coordinate system, whereby the increment steps correspond to angle increments in k-space.

Instead of this, the switching cycle of the gradient fields can also be chosen in such a fashion that the points to be sampled in k-space, having the appropriately adjusted gradient strengths, lie on cylindrical surfaces in a cylindrical coordinate system.

The invention is described more closely and explained below with the embodiments represented in the drawing. The features which can be extracted from the description and the drawing can be utilized in other embodiments of the invention individually or collectively in arbitrary combination.

DESCRIPTION OF THE PREFERRED EMBODIMENT

Figure 1:
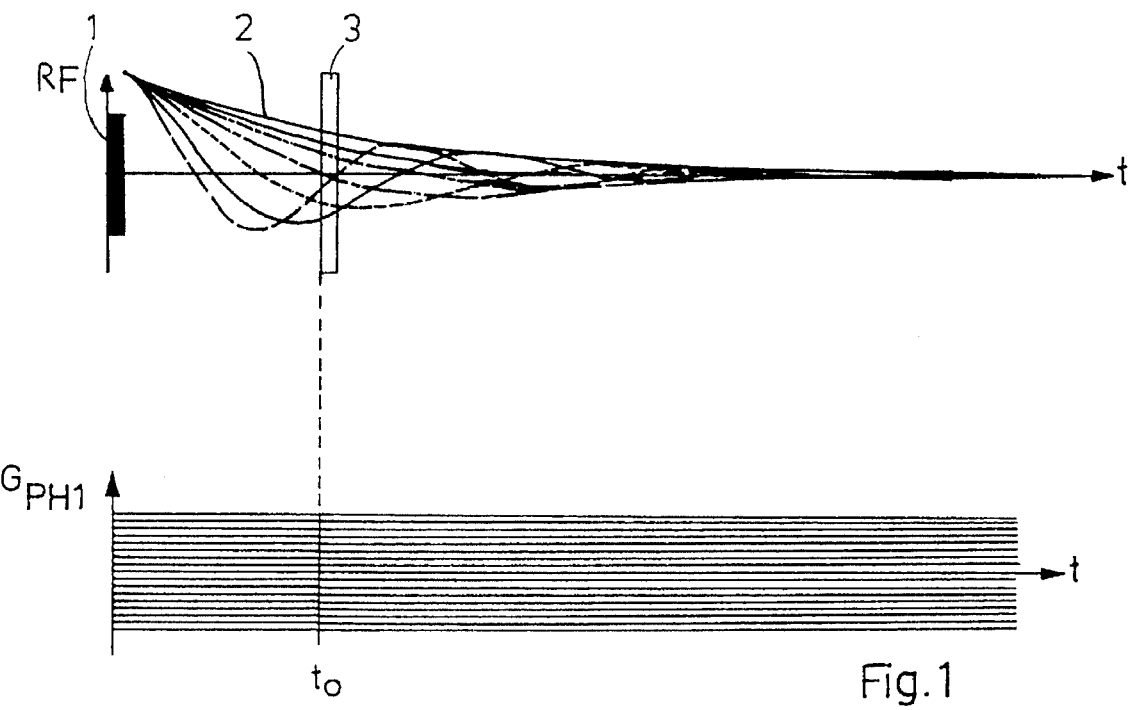
FIG. 1 shows an amplitude versus time diagram of an SPI measuring sequence as it is applied in one embodiment of the method in accordance with the invention for the taking of 1-dimensional NMR images.

In order to produce nuclear magnetic resonance (NMR) signals, a measurement object in a measurement volume located within a highly homogeneous stationary magnetic field $B_0$ directed parallel to a z-axis, is subjected to one or more RF excitation pulses with the assistance of which a free induction decay (FID) of the nuclear spins of interest is excited. "Hard" pulses, for example the 90° pulse 1 indicated in FIGS. 1, 3 and 5, can be utilized to excite the spins within a wide frequency band pass.

The FID signal 2 excited by the RF excitation pulse 1, oscillating with the resonance frequency of the excited nuclear spins, indicated in the drawing as the quasi DC signal which has been mixed-down by the resonance frequency, and having an amplitude damped by various relaxation mechanisms due to the interaction of the excited nuclear spins with their environment with an effective relaxation time $T_2^*$. The recording of merely the FID signal 2 in homogeneous magnetic fields $B_0$ only gives global information concerning the type of nuclei excited. Conclusions about their spatial positions and their density distribution are not possible based on such a signal.

In order to produce NMR images which contain position information concerning the excited nuclei, one or more gradient fields are superimposed on the homogeneous magnetic field $B_0$. The FID signal 2 dephases in a characteristic fashion under the influence of the gradient or gradients so that the measured dephasing of the NMR signal can be correlated with particular position information. In the known NMR imaging method according to Ernst linear gradients are switched sequentially in time following the 90° excitation pulse in the spatial directions x, y and z and during the occurrence of the FID signal. By means of the influence of the gradients the FID signal changes with respect to its phase position and frequency, in each case, in a characteristic fashion so that, by means of successive changing of the gradient, it is possible to sample the measurement volume in the different spatial directions. The measurement values thereby obtained correspond to points in k-space which, following a Fourier transformation, can be assembled into a 3-dimensional image of the object in space.

Figure 5:
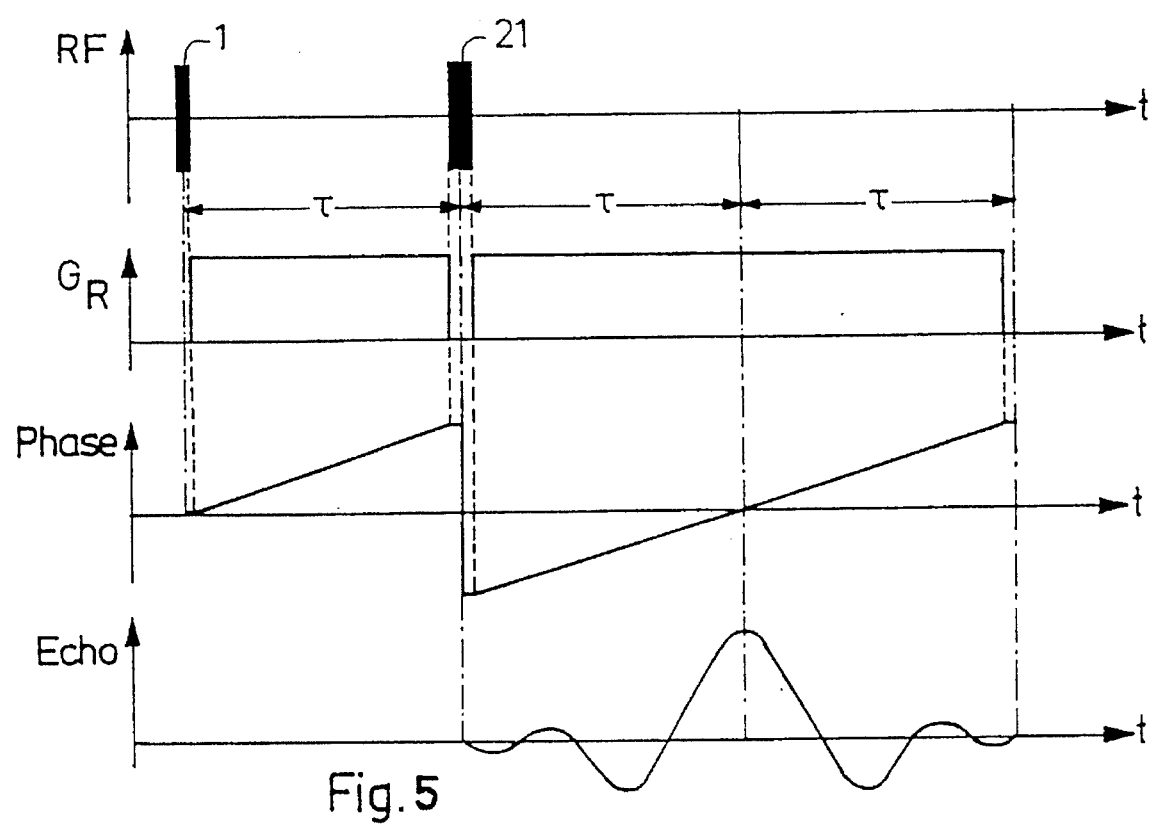
FIG. 5 shows an amplitude versus time diagram of a spin echo experiment according to prior art.

The spin echo method is an improved NMR imaging method compared to the method of Ernst of which FIG. 5 represents a typical measuring sequence. Here, following the 90° excitation pulse 1, a so-called read gradient $G_R$ is applied which effects a continuous dephasing in time of the excited FID signal. After a time duration $\tau$ following the 90° pulse 1 a 180° pulse 21 is irradiated into the measurement volume which tips the spins of the excited nuclei by 180°. The phase also folds-over by 180° as shown in the 3rd line of FIG. 5. After irradiation of the 180° pulse 21 a read gradient $G_R$ is then applied during which the spin echo signal is built up due to the constant rephasing effect of the gradients and at a time $\tau$ after the center of the 180° pulse 21 attains its maximum to, after an additional time duration $\tau$, fall again to a value close to zero. By appropriate timing of the irradiation of additional 180° pulses according to the RARE method, it is possible for an entire series of different phase encoded spin echo signals to be sequentially obtained based on a single FID excitation.

The known spin echo method assumes that the $T_2^*$ relaxation time is sufficiently long in comparison to the entire time duration of a measuring sequence that a sufficiently high signal strength is available at least following a time duration of 2 $\tau$ to 3 $\tau$ following the 90° excitation pulse 1. This is normally the case in important medical applications of water containing tissue. With more solid materials, for example cartilage or bones, it is necessary, however, for the nuclear spins to be detected in a significantly shorter time.

The above mentioned SPI procedure provides a method with which the same or perhaps even qualitatively better information than that achieved by the conventional spin echo method can be obtained, whereby it is also possible to obtain images of materials with significantly shorter effective $T_2$ relaxation times.

FIG. 1 shows a time diagram of the SPI method modified in accordance with the invention for obtaining 1-dimensional NMR images i.e. projections in a single spatial direction. A phase encoding gradient $G_{PH1}$ is applied during irradiation of the excitation pulse 1 under the influence of which the FID signal 2 is dephased. As indicated in the lower line of FIG. 1, in successive measurement runs, the strength of the phase encoding gradient $G_{PH1}$ is changed in each case. The FID signal 2 is recorded within a detection timewindow 3 beginning at time point $t_0$. In this fashion the measurement values collected in the detection window 3 can be combined into an average value and assigned to a single point in k-space.

The time width of the detection window 3 is preferentially sufficiently small that during this time the dephasing is small compared to the phase encoding step.

The phase encoding gradient $G_{PH1}$ remains on during the detection window 3 and is only switched subsequently during the waiting time up to the recording of the next single point signal. This is particularly useful with extremely short time intervals between excitation pulse 1 and detection window 3. Time intervals of only 15 µs have been successfully utilized.

Figure 2:
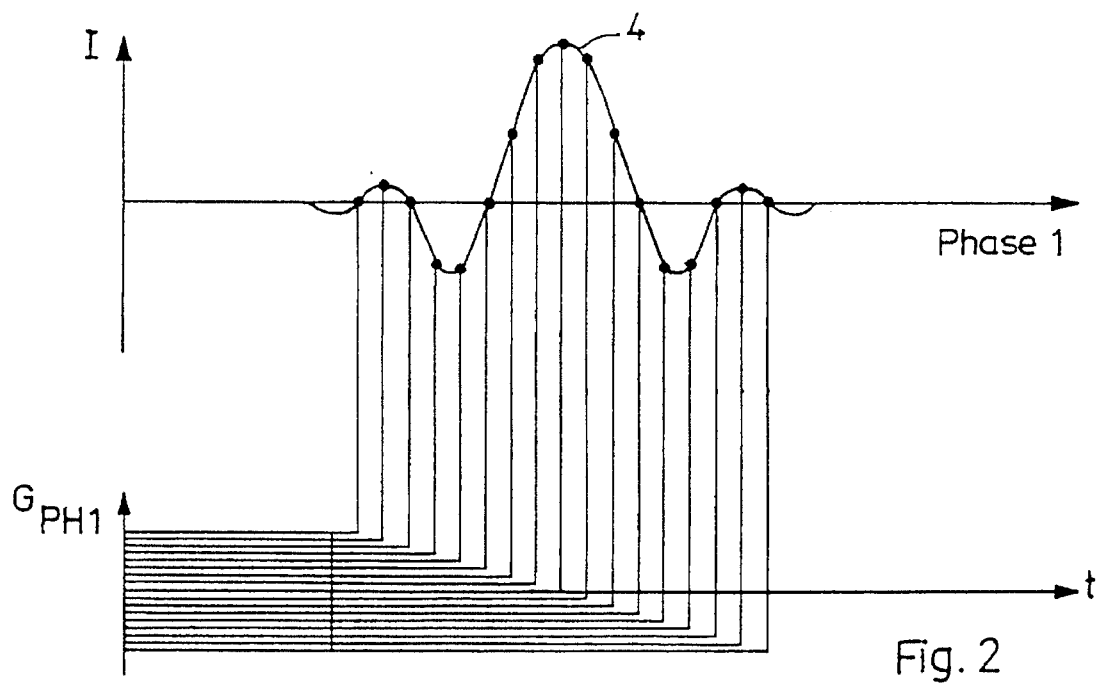
FIG. 2 illustrates an amplitude versus time diagram of a 1-dimensional pseudo echo constructed from the measurement points of the method according to FIG. 1 and the corresponding phase amplitudes.

When the intensity of the measurement points attained in this fashion is sorted according to the corresponding phase position due to the influence of the phase encoding gradient $G_{PH1}$, the pseudo spin echo 4 shown in FIG. 2 is formed. This contains the same information as an echo signal according to the conventional spin echo procedure, whereby all measurement points have, however, been obtained at the same point in time relative to the RF excitation pulse whereas in the known spin echo procedure a $T_2^*$ variation between the individual measurement points due to the gradient fields applied during the measurement is observed.

In order to reduce the noise caused by the conventional switching of gradients in the method in accordance with the invention the gradients are also applied during the waiting time between the recording of individual points and the gradients are not switched from zero to a maximum value in each case, rather only a stepwise change of the gradient fields is effected from one individual point to the next. This is done in such a fashion that at least one of the gradient fields is changed, in each case, between two individual points by only one increment value which is very small compared to the maximum value of the relevant gradient field. The size of the increment value corresponds to one to z-times the separation of two neighboring points in k-space with, preferentially, z<5.

The increment values are preferentially constant. By way of example, it is possible to, going essentially monotonically from zero, increment the appropriate gradient field during each waiting time between the taking of individual points by a constant increment of twice the phase encoding step up to the positive maximum value and then, displaced by a half an increment corresponding to a single phase encoding step, to be stepped linearly down through zero to the negative maximum value and then displaced again by a half an increment to be switched linearly back towards zero. The envelope of all gradient values formed in this fashion is therefore triangular shaped, neglecting the very small increment steps, linear over a range and, in general, continuous without, in particular, exhibiting any large switching steps. 128 or 256 values are adjusted per gradient in a typical case so that the increment which must be instantaneously adjusted only corresponds to 1/64 or 1/128 of the maximum gradient value, which drastically reduces the resulting switching bang to a tolerable level.

One can proceed similarly with a second, third or additional gradient. These then follow similar increment curves which, however, are switched over every 128 or 256 "shots". The frequency of the pulse sequence with the additional gradient fields is therefore correspondingly lower (with a second gradient field typically in the range of seconds) not, however, the frequency components of the actual switching itself. Since even a bang which "only" occurs once a second is extremely uncomfortable, it is also important with the second gradient field to avoid discontinuities when switching. With third gradients the switching time slides into the range of minutes and one can accept, in simple embodiments of the invention, the small number of switching steps associated with switching bangs, particularly for the higher dimensions where a lower number of increments are, in any event, generally necessary.

Since an increased thermal load is to be expected with constant current flow through the gradient coil system it is possible, in variations of the inventive method, to occasionally execute larger switching steps in the increment curve when switching the second, third or additional gradient fields with which the gradient strength of the correspondingly switched gradient field is changed by at least ten times a phase encoding step, preferentially by half of the maximum gradient strength, whereby the large switching steps should, however, be separated from another by at least half a minute or longer. In this fashion, the thermal behavior of the system is improved.

In particular with initial values of the gradient strength to be switched which are different from zero it is possible to turn on the corresponding current values in the gradient system over an extended period of time, preferentially, at least ten times longer than the time duration of a gradient switching procedure under the normal switching method. In particular with gradient fields whose gradient strengths are changed infrequently it is possible for all switching points to always be extended over time, i.e. turned on "softly".

Figure 4A:
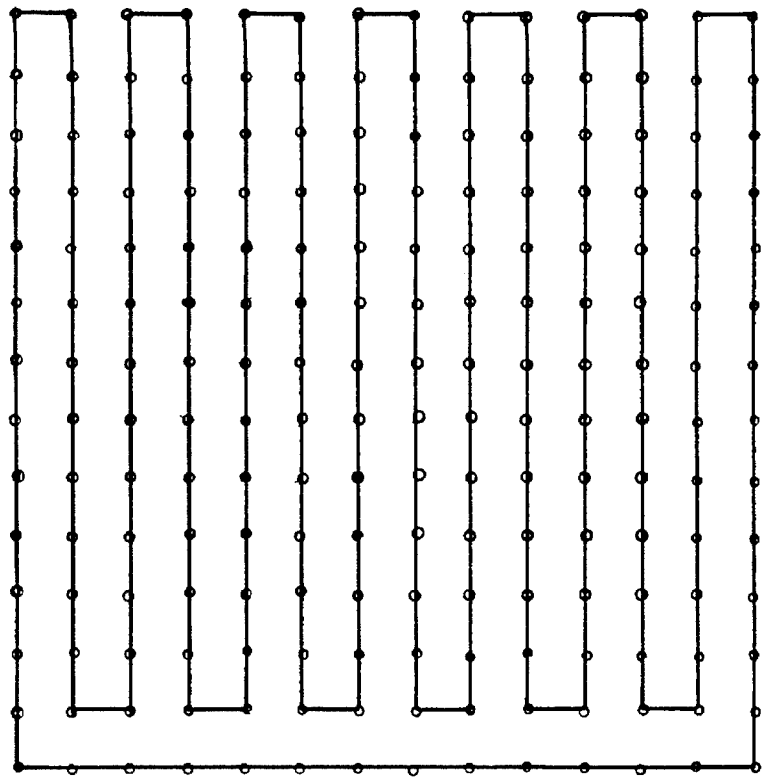
FIG. 4a shows schematic increment curves in 2-dimensional k-space with a crossing-free meandering.
Figure 4B:
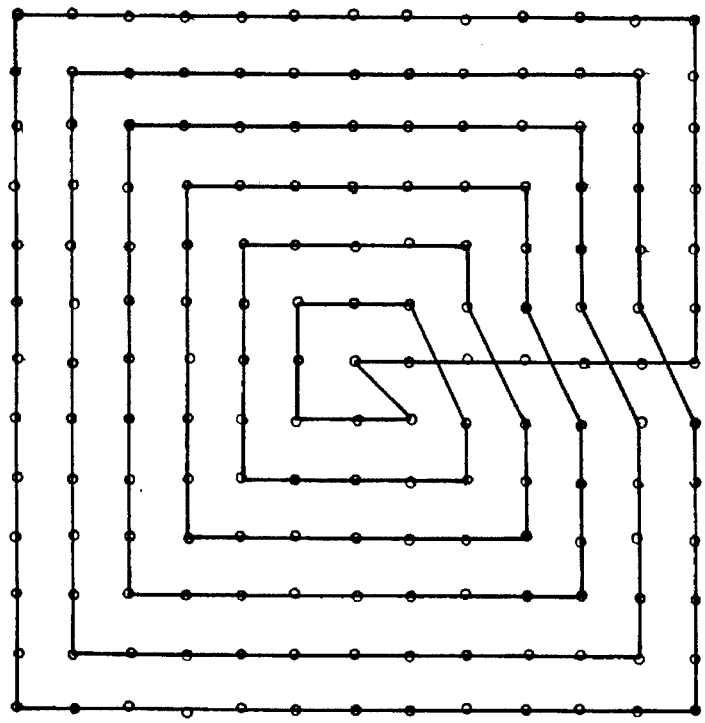
FIG. 4b shows schematic increment curves in 2-dimensional k-space with low crossing spiral shaped dependence.

Concrete examples for 2-dimensional increment steps of the points in k-space to be accessed which are selected with the corresponding gradient strengths are shown in FIGS. 4a and 4b. Thereby FIG. 4a shows a closed, crossing-free curve with a "meandering" dependence and FIG. 4b shows a spiral shaped curve which exhibits at least few crossing points. An arbitrary number of other paths through k-space are also possible, whereby one should only guarantee that all points to be sampled are incorporated. In addition, one should take care that, at the end, one returns to the starting point without any large switching steps. This can be achieved, for example, in that one always skips over points lying on a line between the beginning and the end point.

An additional 2-dimensional example for an increment curve of this kind with which the gradients run from −63 to +64, whereby each point in k-space is represented by the pair $k_x/k_y$, in a preferred embodiment, can be as follows:

| | |
|---|---|
| 0/02/04/0 . . 64/063/061/0 . . +1/00−1/0 . . −63/0−62/0−60/0−58/0 | −1/0 |
| 0/2 2/2 4/2 | −1/2 |
| . | |
| . | |
| . | |
| 0/64 2/64 | −1/64 |
| 0/63 2/63 | −1/63 |
| . | |
| . | |
| . | |
| 0/1 2/1 | −1/1 |
| 0/−1 2/−1 | −1/−1 |
| 0/−63 2/−63 | −1/−63 |
| 0/−62 2/−62 | −1/−62 |
| 0/−1 2/−1 | −1/−1 |

In this fashion all points in (two-dimensional) k-space are passed through. This scheme can be extended to three dimensions.

It is particularly preferred when the method in accordance with the invention is used with the known back projection method. In this fashion gradient field switching cycles can be chosen in such a way that the points to be sampled in k-space, which are selected by the corresponding gradient strengths lie on concentric spherical shells in an n-dimensional spherical coordinate space, whereby the increment steps correspond to angle increments in k-space. The points in k-space can, however, also lie on surfaces of cylinders in a cylindrical coordinate system, whereby the axial coordinates are advantageously scanned sequentially. The main advantage of the application of the back projection method is that this is a very accessible method of NMR imaging which is available in most laboratories. Measurement data recorded in a fashion which is advantageous for this method can subsequently be further processed with available standard software in a particularly simple fashion.

Diffusion effects due to the spatial motion of nuclei, whose strength is proportional to the third power of the gradient strength and proportional to the square of the influence time and which lead to undirected flow effects, have significantly less influence on the measurement values in the method in accordance with the invention than in the known spin echo method since only one amount of time comparable to the time duration τ of FIG. 5 is necessary per recording sequence for recording a pseudo spin echo 4, whereas the sequence duration in the spin echo method is 3 τ.

Through the application of two phase encoding gradients $G_{PH1}$ and $G_{PH2}$ it is possible to produce a 2-dimensional NMR image with the method in accordance with the invention which, following appropriate Fourier transformation, forms a silhouette of the measured object similar to an X-ray image.

Figure 3:
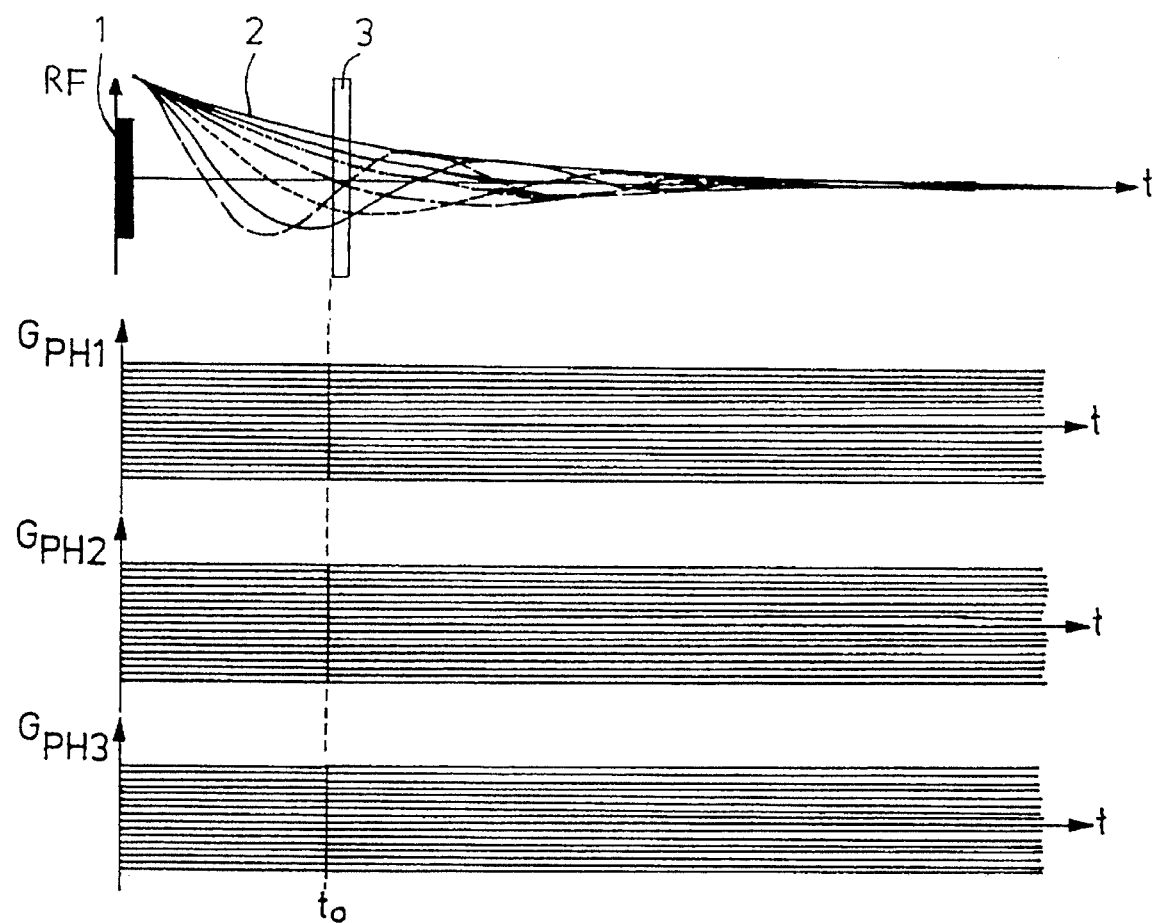
FIG. 3 shows an amplitude versus time diagram of an SPI sequence in accordance with the invention for the taking of 3-dimensional NMR images.

A time diagram of a measurement sequence for the recording of a 3-dimensional NMR image is shown in FIG. 3. The nuclear spins are again excited with a broad band pulse 1 and three phase encoding gradients $G_{PH1}$, $G_{PH2}$, and $G_{PH3}$ subsequently influence the nuclear spins. One or more measurement values of the FID signal 2 are recorded in detection window 3 and are combined to an average measurement point in k-space. In the second measurement step, following the RF excitation pulse 1, the second and third phase encoding gradients remain unchanged in each case whereas the strength of the first phase encoding gradient is changed. The subsequent measurement steps proceed in the same fashion until all desired values of the first phase encoding gradient $G_{PH1}$ are stepped through. In the next measurement step the second value of the second phase encoding gradient $G_{PH2}$ is adjusted, whereby the variation of the first phase encoding gradient $G_{PH1}$ starts again from the beginning. The same procedure is then applied for the variation of the third phase encoding gradient. The measurement is then ended after phase space is varied, for example, 256·128·128 times and appropriately sampled. Clearly, the sequence of the encodings can be changed in an arbitrary fashion.

In comparison to conventional spin echo experiments with a repetition rate of, for example, 1 second, an entire measurement time of 1165 hours is necessary for 256·128·128 data points.

In order to shorten the measurement time to a tolerable level, the following various steps can be undertaken:

An additional acceleration of the method can be effected through rapid repetition of the RF excitation pulse, whereby the nuclear spins of the measurement object are coherently deflected only by a relatively small flip angle from their original direction parallel to the homogeneous magnetic field $B_0$.

The increase loss in signal to noise ratio due to the increased repetition rate can be compensated for through digital and/or analog filtering of the data. If data detection takes place at the resonance frequency it is possible, in an advantageous case, to filter out all frequencies outside of the resonance frequency. It is also possible for the measurement values recorded within the detection window 3 to be fit or filtered to the dependence of a curve of the time varying FID signal produced by the RF excitation pulse 1 and a weighted average to be thereby derived.

The remaining measurement time can be halved if only one half of the pseudo spin echo 4 is recorded. This is possible without loss of information since, in contrast to the conventional spin echo signals which are distorted by the different $T_2^*$ relaxations of the individual measurement points the present pseudo spin echo 4 is completely symmetric.

With a repetition time of approximately one millisecond, when utilizing the above mentioned measures, the measurement time for the example described can be reduced from 1165 hours to a realistic time of less than 5 minutes.

The inventive method can, in particular, also be utilized in combination with or as a component of the per se known in the art pulse sequence for determining flow or $T_1$-dependencies (inversion recovery method).

We claim:

1. A method for n-dimensional NMR imaging comprising the steps of:
   a) positioning a measurement object within a measurement volume of a homogeneous magnetic field, the field having a direction parallel to a z-axis;
   b) overlapping the homogeneous magnetic field with n gradient fields;
   c) irradiating an RF excitation pulse into the measurement volume;
   d) recording, following the RF excitation pulse, a measurement value of an NMR signal from the measurement volume within a detection time-window;
   e) assigning the measurement value to a single point of an n-dimensional matrix in a k-space;
   f) stepwise changing a first gradient strength of a first gradient field by an increment value which is small compared to a maximum value of the first field, the increment value corresponding to an integral multiple m=1, 2, 3, ... of a phase encoding step corresponding to a separation between two neighboring points in k-space, wherein the first gradient field is not switched-off between two successive recordings;
   g) repeating steps c) through f) to sample the n-dimensional matrix in k-space; and
   h) reconstructing an n-dimensional image from the n-dimensional matrix in k-space.

2. The method of claim 1, characterized in that m is held constant over a plurality of successive steps.

3. The method of claim 2, wherein step f) comprises the steps of:
   f1) successively increasing, starting from a first gradient strength of zero, the first gradient strength by increment values with m=2 up to an end value;
   f2) increasing, following step f1), the first gradient strength by one increment value with m=1;
   f3) successively decreasing, following steps f1) and f2), the first gradient strength by increment values with m=2 down to a negative end value;
   f4) changing, following steps f1) through f3), the first gradient strength by one increment value with m=1; and
   f5) successively increasing, following steps f1) through f4), the first gradient strength by increment values with m=2.

4. The method of claim 3 wherein n>2 and further comprising the step of incrementing a second gradient strength of a second gradient field in the same fashion as the first gradient strength, wherein the second gradient strength has a second time period between increments equal to a number of increments per period times a first time period between increments of the first gradient strength.

5. The method of claim 1, wherein n>2 and, in step f), the first gradient strength is changed by at least one of a first isolated increment value and a second isolated increment value, the first and second isolated increment values with m>10, and the first isolated, increment value being separated in time from the second isolated increment value by at least 30 seconds.

6. The method of claim 1, wherein step f) comprised the step of gradually increasing the first gradient strength from a value different than zero over a period of time which is a least 10 times longer than a time corresponding to a gradient switching cycle.

7. The method of claim 6, wherein n>2 and a second gradient strength of a second gradient field is gradually increased at second time intervals which are long compared to a first time interval between successive increments of the first gradient strength.

8. The method of claim 1, wherein in step f), the first gradient strength is stepwise changed to successively sample points in k-space lying on a closed curve having a low number of crossings.

9. The method of claim 1, wherein step d) comprises the step of recording a first and a second NMR signal, the first signal being 90° phase shifted with respect to the second signal.

10. The method of claim 1, wherein in step c) comprises the step of irradiating an RF excitation pulse to flip spins in the measurement object away from the z-axis by an angle which is much less than 90° and step g) is executed at an increased repetition rate.

11. The method of claim 1, wherein step c) comprises the step of:
   c1) irradiating an RF excitation pulse to flip spins in the measurement object by 90° relative to the z-axis; and further comprises the step of
   c2) irradiating a flip back pulse into the measurement volume to transfer a transverse magnetization back into the z-direction.

12. The method of claim 1, wherein in step e), an average measurement value is formed from a plurality of measurement values recorded in one detection time-window of step d) and assigned to the single point in k-space.

13. The method of claim 1, further comprising the step of filtering measurement values taken in step d) in one detection window with at least one of a digital and an analog filter.

14. The method of claim 13, wherein the measurement values are fit to a curve of time varying FID signals produced by the RF excitation pulse resulting from a $T_2^*$ decay in combination with a progressive dephasing by the first gradient field to extract a weighted average.

15. The method of claim 1, wherein in step f), the first gradient strength is stepwise changed to sample only points in k-space belonging to one of two symmetric halves of Fourier transformed measurement values.

16. The method of claim 1, wherein n>2 and, further comprising the step of stepwise changing a second gradient strength of a second gradient field simultaneous to the stepwise changing of the first gradient strength.

17. The method of claim 1, wherein, in step g), a time of the detection time-window of step d) is held constant relative to a time of the RF excitation pulse of step a).

18. The method of claim 1, wherein, in step h), a back projection method is used.

19. The method of claim 18, wherein in step f), the first gradient strength is stepwise changed to sample points in k-space lying on concentric spherical shells in a spherical coordinate system, wherein the increment value corresponds to an angle increment in k-space.

20. The method of claim 18, wherein, in step f), the first gradient strength is stepwise changed to sample points in k-space lying on cylindrical surface in a cylindrical coordinate system.

21. A method for n-dimensional NMR imaging comprising the steps of:
- a) positioning a measurement object within a measurement volume of a homogeneous magnetic field, the field having a direction parallel to a z-axis;
- b) overlapping the homogeneous magnetic field with n gradient fields;
- c) irradiating an RF excitation pulse into the measurement volume;
- d) recording, following the RF excitation pulse, a measurement value of an NMR signal from the measurement volume within a detection time-window;
- e) assigning the measurement value to a single point of an n-dimensional matrix in a k-space;
- f) stepwise changing a first gradient strength of a first gradient field by an increment value which is small compared to a maximum value of the first field, the increment value corresponding to an integral multiple, m=1, 2, 3 ... of a phase encoding step corresponding to a separation between two neighboring points in k-space, wherein the first gradient field is not switched-off between two successive recordings;
- f1) successively increasing, starting from a first gradient strength of zero, the first gradient strength by increment values with m=2 up to an end value;
- f2) increasing, following step f1), the first gradient strength by one increment value with m=1;
- f3) successively decreasing, following steps f1) and f2), the first gradient strength by increment values with m=2 down to a negative end value;
- f4) changing, following steps f1) through f3), the first gradient strength by one increment value with m=1;
- f5) successively increasing, following steps f1) through f4), the first gradient strength by increment value with m=2.
- g) repeating steps c) through f5) to sample the n-dimensional matrix in k-space; and
- h) reconstructing an n-dimensional image from the n-dimensional matrix in k-space.

22. A method for n-dimensional NMR imaging comprising the steps of:
- a) positioning a measurement object within a measurement volume of a homogeneous magnetic field, the field having a direction parallel to a z-axis;
- b) overlapping the homogeneous magnetic field with n gradient fields;
- c) irradiating an RF excitation pulse into the measurement volume;
- d) recording, following the RF excitation pulse, a measurement value of an NMR signal from the measurement volume within a detection time-window;
- e) assigning the measurement value to a single point of an n-dimensional matrix in a k-space;
- f) stepwise changing a first gradient strength of a first gradient field by a phase encoding step which is small compared to a maximum value of the first field, the phase encoding step corresponding to a separation between two neighboring points in k-space, wherein the first gradient field is not switched-off between two successive recordings;
- f1) successively increasing, starting from a first gradient strength of zero, the first gradient strength up to an end value;
- f2) successively decreasing, following step f1), the first gradient strength down to a negative end value;
- f3) successively increasing, following steps f1) and f2), the first gradient strength;
- g) repeating steps c) through f3) to sample the n-dimensional matrix in k-space, wherein exactly as many RF excitation pulses are irradiated as sample points in k-space; and
- h) reconstructing an n-dimensional image from the n-dimensional matrix in k-space.

* * * * *